United States Patent [19]

Takemura et al.

[11] Patent Number: 5,183,699
[45] Date of Patent: Feb. 2, 1993

[54] WAFER PROCESSING FILMS

[75] Inventors: Yasuo Takemura; Osamu Narimatsu; Kazuyoshi Komatsu, all of Nagoya, Japan

[73] Assignee: Mitsui Toatsu Chemicals, Inc., Tokyo, Japan

[21] Appl. No.: 667,402

[22] PCT Filed: Jul. 30, 1990

[86] PCT No.: PCT/JP90/00967
§ 371 Date: Apr. 1, 1991
§ 102(e) Date: Apr. 1, 1991

[87] PCT Pub. No.: WO91/02377
PCT Pub. Date: Feb. 21, 1991

[30] Foreign Application Priority Data
Aug. 1, 1989 [JP] Japan .................................. 1-197965

[51] Int. Cl.⁵ ................................................ B32B 7/02
[52] U.S. Cl. ....................................... 428/214; 428/40; 428/343; 428/522
[58] Field of Search ................. 428/343, 451, 40, 447, 428/446, 214, 522

[56] References Cited

U.S. PATENT DOCUMENTS

| | | | |
|---|---|---|---|
| 4,756,968 | 7/1988 | Ebe et al. | 428/343 |
| 4,853,286 | 8/1989 | Narimatsu et al. | 428/343 |
| 4,928,438 | 5/1990 | Narimatsu et al. | 428/343 |

FOREIGN PATENT DOCUMENTS

| | | |
|---|---|---|
| 58-131631 | 9/1983 | Japan . |
| 59-4669 | 1/1984 | Japan . |
| 61-168683 | 7/1986 | Japan . |
| 61-260629 | 11/1986 | Japan . |
| 62-218467 | 9/1987 | Japan . |
| 63-177423 | 7/1988 | Japan . |

*Primary Examiner*—Edith Buffalow
*Attorney, Agent, or Firm*—Cushman, Darby & Cushman

[57] ABSTRACT

The present invention relates to a wafer processing film used for the prevention of breakage upon grinding a semiconductor wafer. The wafer processing film has a base film an adhesive layer provided on one surface of the base film and a synthetic resin film arranged on the adhesive layer. The surface roughness of the surface of the synthetic resin film in contact with the adhesive layer is not greater than 2 μm.

The present invention provides a wafer processing film which can protect the surface of a wafer from contamination and corrosion after grinding the wafer.

5 Claims, No Drawings

WAFER PROCESSING FILMS

DESCRIPTION

1. Technical Field

The present invention relates to a wafer processing film which is used when grinding wafers such as silicon wafers so as to prevent their breakage.

2. Background Art

Semiconductor integrated circuits (ICs) are generally fabricated by slicing a semiconductor material such as a high-purity silicon single crystal into a wafer, forming integrated circuits therein through etching or the like, and then dicing the resultant wafer into chips.

In a step in which the back side of an IC wafer is ground and polished, it is a routine practice to affix a wafer processing film, which has an adhesive layer, onto the surface of the wafer so that breakage to the wafer can be prevented and the grinding work can be facilitated.

A wafer processing film is generally produced by coating an adhesive on one surface of a base film and then drying the same to form an adhesive layer on the base film. A synthetic resin film called a "separator" is applied over the adhesive layer to protect the adhesive layer during storage or transportation of the wafer processing film, whereby the wafer processing film has a structure such that the adhesive layer is sandwiched between the base film and the separator. Upon grinding the wafer, the separator is peeled off and the wafer processing film is adhered to the wafer. After completion of the grinding, the wafer processing film is peeled off from the wafer.

If air is included between the adhesive layer of the wafer processing film and a wafer when the processing film is applied to the surface of the wafer, the adhesive tends to remain on the surface of the wafer when the film is peeled off from the wafer. This residue causes corrosion of the resulting IC wafer so that the performance of the IC is lowered.

Further, adhesion of any foreign matter to the surface of the wafer from the film also induces corrosion of the resulting IC wafer, resulting in a reduction in the performance of the IC.

To cope with the problem of air inclusion, the following method is proposed in Japanese Utility Model Laid-Open No. 131631/1983 by way of example. According to the method, a resin film whose surface roughness has been improved to the range of ±0.1 μm by coating a silicone-base release agent is employed as a separator (release layer), so that the surface of a pressure-sensitive adhesive layer as an adhesive layer is prevented from being roughened by the separator and, upon application of the wafer processing film to a wafer, air is prevented from being included between the adhesive layer of the film and the wafer. Because of the use of the silicone-base release agent, this method is, however, accompanied by the drawback that the release agent is transferred to the adhesive layer to contaminate the surface of the semiconductor wafer. This method is therefore not satisfactory.

According to the method proposed in Japanese Patent Application Laid-Open NO. 177423/1988, a semiconductor wafer fixing member with a release layer made of low-density polyethylene or polymethylpentene is used, and as a result, contamination of the semiconductor wafer due to transfer of the release agent or the like from the separator can be avoided. However, because of the high surface tension of low-density polyethylene, the peelability between a pressure-sensitive adhesive layer as an adhesive layer and the release layer is so poor that the surface of the adhesive layer is roughened when the release layer is peeled off from the semiconductor wafer fixing member. As a result, a number of fine air-filled spacings is formed at the interface between the adhesive layer and the wafer. When the wafer processing film is peeled off after the back side of the wafer has been ground and polished, the adhesive tends to remain around the air-contacted spots on the surface of the wafer and the adhesive residue causes corrosion of the wafer.

As has been described above, it is the current circumstance that, as a wafer processing film to be employed upon grinding an IC wafer, there is no useful film capable of preventing contamination and corrosion of the surface of the wafer.

DISCLOSURE OF THE INVENTION

It is an object of the present invention to overcome the above-described problems and to provide an excellent wafer processing film, which is useful upon grinding a wafer. Specifically, it is an object of the present invention to provide a wafer processing film which can leave the surface of a wafer free from contamination and corrosion.

The present invention therefore provides a wafer processing film comprising a base film, an adhesive layer provided on one surface of said base film and a synthetic resin film arranged on said adhesive layer. The surface roughness of the surface of said synthetic resin film, said surface being in contact with said adhesive layer, is not greater than 2 μm. The synthetic resin film will hereinafter be called the "separator".

Corrosion of the surface of the wafer occurs if, upon peeling off wafer processing film from the surface of a wafer subsequent to grinding of the wafer, any adhesive remains on the surface of the wafer or the surface of the wafer is contaminated with any material adhered thereto.

The adhesive tends to be left behind on the wafer surface especially around air-contacted spots thereof when air is included between the adhesive layer and the wafer. To avoid the inclusion of air between the adhesive layer and the wafer, it is desirable to make the surface of the adhesive layer flat, said surface to be adhered to the surface of the wafer. For this purpose, it is effective to reduce the surface roughness of the separator.

On the other hand, to avoid the adhesion of any contaminant to the surface of a wafer, it is effective not to coat the surface of the separator with a wafer contaminant such as a release agent.

It is also desired to use a separator having good releasability, because poor releasability results in roughening of the surface of the adhesive layer when the separator is peeled off from the adhesive layer.

It is also effective to avoid the use of a lubricant or the like in a large amount in a separator since the inclusion of the lubricant or the like in a large amount causes bleeding of the lubricant or the like and results in its transfer to the surface of the adhesive layer.

With the foregoing in view, the present inventors have proceeded with an investigation resulting in the present invention.

Owing to the use of a separator having little surface roughness, the separator does not cause roughening of the surface of the adhesive layer in the wafer processing film according to the present invention. As a result, no air is included between the adhesive layer and the wafer when the wafer processing film is applied to the wafer. The adhesive is therefore not left behind on the surface of the wafer when the wafer processing film is peeled off from the wafer. Accordingly, the use of the wafer processing film according to the present invention has the excellent advantage that a wafer can be processed without contamination and corrosion.

BEST MODE FOR CARRYING OUT THE INVENTION

Wafers to which wafer processing films of the invention can be applied include not only silicon wafers but also any semiconductor wafers such as germanium wafers, gallium-arsenic wafers, gallium-phosphorus wafers and gallium-arsenic-aluminum wafers.

No particular limitation is imposed on the production process of separators to be used in the invention. They can be made of a synthetic resin film produced by any conventional process such as extrusion, blown film extrusion or calendering.

Exemplary materials for separators include synthetic resins such as polyolefins, polyesters, polyamides, polyacrylic resins and polypropylene. Among these, polypropylene is preferred. Use of a synthetic resin having high surface tension and poor releasability as a separator is not preferred because the separator roughens the surface of an adhesive layer.

The use of a biaxially-stretched polypropylene film as a separator is preferred. When an unstretched film or uniaxially-stretched film is used as a separator, the unstretched film may be elongated and the uniaxially-stretched film may be torn in the stretched direction when the separator is peeled off from the wafer processing film The workability is hence impaired whichever problem takes place. The transparency of a film is generally improved when subjected to biaxial stretching. Therefore, biaxially-stretched films are also preferred from the standpoint of prevention and control of wafer contamination because the inclusion of foreign matters can be easily discovered.

The thickness of a separator is preferably 10–2,000 $\mu$m, with 20–200 $\mu$m being more preferred. If it is smaller than 10 $\mu$m, the workability is impaired. If it is greater than 2,000 $\mu$m, the flexibility is reduced to the point that the workability is impaired. Thickness outside the above range is therefore not preferred.

The surface roughness of the separator on the side to be brought into a contiguous relation with the adhesive layer is not greater than 2 $\mu$m in terms of the maximum height over the standard length of 0.8 mm as stipulated in JIS B 0601. The term "standard length" as used herein, means a standard measurement length of a sample when the surface roughness of a surface of the sample is measured. If this surface roughness exceeds 2 $\mu$m, the separator roughens the surface of the adhesive layer. As a result, when the separator is peeled off and the wafer processing film is adhered to a wafer, air is included between the wafer and the adhesive layer. When the wafer processing film is peeled off from the wafer, the adhesive remains in the form of spots on the surface of the wafer. Such adhesive residue causes corrosion of the wafer. Such large surface roughness is therefore not preferred.

Preferred as a separator to be used in the invention is a synthetic resin film having a Shore "D" hardness of 30 or higher as measured in accordance with ASTM D-2440. If this hardness is lower than 30, the film has insufficient stiffness and the workability is impaired.

The separator employed in the invention preferably has a lubricant content not greater than 0.5 part by weight per 100 parts by weight of the synthetic resin. More preferably, the lubricant content is 0–0.1 part by weight Lubricant content greater than 0.5 part by weight result in bleeding of the lubricant on the surfaces of the separators so that the associated adhesive layers are contaminated. Such high lubricant content is therefore not preferred. Lubricant content not greater than 0.1 part by weight is substantially free from lubricant bleeding, whereby the associated adhesive layers are free from contamination. It is most preferable that no lubricant is contained.

Exemplary lubricants usable in the invention include those generally called "lubricants", e.g., glycerin monoesters such as glycerin monostearate, bisamides such as methylene bisstearylamide and aliphatic amides such as erucic amide; as well as those added as hydrochloric acid scavengers, such as calcium stearate.

The total content of additives other than lubricants, namely, stabilizers (antioxidants) such as 2,6-di-tert.-butyl-4-methylohenol and inorganic fillers such as silica and talc should preferably be not higher than 1 part by weight per 100 parts by weight of the resin in order to prevent contamination of the adhesive layer.

The synthetic resin film for the separator can be suitably chosen from commercial products. From the standpoint of prevention of wafer contamination, a film produced in an environment whose air cleanliness class is Class 100,000 or less is preferred. The term "Class 100,000 or less" indicates that not more than 100,000 dust particles of 0.5 $\mu$m or greater are contained per one cubic feet of the air in the working environment.

No particular limitation is imposed on the production method or the kind of base film employed in the invention. It can be suitably selected from synthetic resin films produced by conventional processes such as extrusion, blown film extrusion or calendering. Examples of the material of the base film include thermoplastic elastomers such as ethylene-vinyl acetate copolymers, polybutadiene, plasticized vinyl chloride resin, polyolefins, polyesters and polyamides; and synthetic rubbers such as diene rubbers, nitrile rubbers, silicone rubbers and acrylic rubbers. Among these, films having a Shore hardness of 40 or lower as measured in accordance with ASTM D-2440 are preferred in order to effectively absorb impacts and protect the wafer during grinding.

The thickness of the base film can be suitably determined depending on conditions such as the shape of a wafer to be protected, the surface condition of the wafer and the manner of grinding. In general, 20–2000 $\mu$m is preferred.

No particular limitation is imposed on the type of the adhesive employed in the adhesive layer of the invention as long as it has adhesiveness. A conventional adhesive such as an acrylic adhesive or a rubber-base adhesive can be used.

The thickness of the adhesive layer formed on the surface of the base film can be suitably determined depending on conditions such as the surface conditions of a wafer, the shape of the wafer and the manner of grinding. Generally, 2–100 $\mu$m is preferred, with 5–50 $\mu$m being more preferred.

As a method for coating the adhesive to the base film, a conventional coating method, for example, roll coating, gravure coating, bar coating or the like can be employed. One side of the base film is coated entirely.

The present invention will hereinafter be described by the following examples although they do not limit the invention.

The evaluations in the following examples and comparative examples were effected by the following methods:

a. Degree of Oxidation

Generally, the surface of even a fresh silicon wafer has been lightly oxidized and includes silicon oxide. When this wafer surface is subjected to an elementary analysis by ESCA, the ratio of the peak area of oxygen to that of silicon is 1.30 on average. When the wafer surface is corroded, the amount of silicon oxide in the surface increases so that the ratio of the peak area of oxygen to that of silicon becomes greater than 1.30. The degree of oxidation was judged on the basis of the ratio of 1.30.

Measuring Apparatus and Conditions for ESCA

Apparatus: "ESCA LAB MK II", trade name Manufactured by VG Scientific Co.
X-ray source: Mg K$\alpha$ rays
X-ray output: 300W
Vacuum level for measurement: $1 \times 10^{-9}$ mbar max.

b. Degree of Contamination

The degree of contamination due to any remaining adhesive and/or the like was investigated using a laser surface inspection apparatus, "HLD-300B" (trade name) manufactured by Hitachi Denshi Engineering, Ltd. The degree of contamination was expressed in terms of the number of contaminated spots having a diameter of at least 0.2 $\mu$m.

c. Breakdown Voltage

Voltage was gradually increased across the terminals of each IC wafer. The voltage at which the IC was broken was recorded as its breakdown voltage. The measuring method comprised sticking a wafer processing film on the front side of an IC wafer, grinding and polishing the back side of the wafer, peeling off the film, allowing the wafer to stand for 2000 hours in an environment of 70° C. and 80% R.H., and then measuring the breakdown voltage. The breakdown voltage of the IC was 22 V when the wafer was free from corrosion. This voltage was employed as a standard value. The breakdown voltage drops as the corrosion of a wafer increases.

EXAMPLE 1

A commercial ethylene-vinyl acetate copolymer resin film of 200 $\mu$m thick was provided as a base film. One side of the base film was subjected to corona treatment. An acrylic adhesive (product of Mitsui Toatsu Chemicals, Inc.; "AROMATEX", trade mark) was coated on the corona-treated side of the film by a roll coater and was then dried, whereby a wafer processing film provided with an adhesive layer of about 30 $\mu$m thick was prepared.

To 100 parts by weight of polypropylene resin, 0.1 part by weight of erucic amide was added as a lubricant. In an environment of Class 100,000, a biaxially-stretched polypropylene film having a surface roughness of 1 $\mu$m max. was produced as a separator.

The separator was arranged over the adhesive layer of the adhesive film, so that a wafer processing film was obtained.

The separator was peeled off from the wafer processing film and was adhered to a surface of a mirror wafer (diameter: 4 inches). After they were left for 24 hours, the film was peeled off from the wafer and the degree of oxidation and contamination of the wafer were evaluated. The results are shown in Table 1.

In another case, the separator was peeled off from the wafer processing film and the film was adhered to the surface of an IC silicon wafer (diameter of 4 inches) with aluminum patterns formed thereon. After being left for 24 hours, the film was peeled off and the breakdown voltage of the IC silicon wafer was measured. The results are shown in Table 1. No problems were encountered in workability when the separator was peeled off from the wafer processing film.

EXAMPLE 2

An experiment was conducted in a similar manner to Example 1 except that the amount of erucic amide was changed to 0.5 part by weight and the maximum value of the surface roughness of the separator was controlled at 2 $\mu$m. The results are shown in Table 1. No problems were encountered in workability when the separator was peeled off from the wafer processing film.

EXAMPLE 3

An experiment was conducted in a similar manner to Example 1 except that the amount of erucic amide was changed to 0.5 part by weight and a uniaxially-stretched polypropylene film was produced as a separator. The results are shown in Table 1. Tearing of the separator in the stretched direction was observed on extremely rare occasions when the separator was peeled off from the wafer processing film.

EXAMPLE 4

An experiment was conducted in a similar manner to Example 1 except that a commercial butadiene rubber sheet 300 $\mu$m thick was used as a base film and a biaxially-stretched polypropylene film with an addition of 10 part by weight of erucic amide and having surface roughness of 2 $\mu$m max. was employed as a separator. The results are shown in Table 1. No problems were encountered in workability when the separator was peeled off from the wafer processing film.

EXAMPLE 5

An experiment was conducted in a similar manner to Example 1 except that a commercial butadiene rubber sheet 300 $\mu$m thick was used as a base film and a biaxially-stretched polyethylene terephthalate film with an addition of 0.1 part by weight of erucic amide and having surface roughness controlled at 1 $\mu$m max. was employed as a separator. The results are shown in Table 1. The releasability of the separator was not very good.

EXAMPLE 6

An experiment was conducted in a similar manner to Example 1 except for the use of a biaxially-stretched polypropylene film which was obtained without adding erucic amide and with a surface roughness of 0.5 $\mu$m max. The results are shown in Table 1. No problems were encountered in workability when the separator was peeled off from the wafer processing film.

Comparative Example 1

An experiment was conducted in a similar manner to Example 1 except that a biaxially-stretched polypropylene film obtained by adding 2.5 parts by weight of erucic amide and having a surface roughness of 3 μm max. was used as a separator. The results are shown in Table 1. No problems were encountered in workability when the separator was peeled off from the wafer processing film.

Comparative Example 2

An experiment was conducted in a similar manner to Example 1 except that a commercial butadiene rubber sheet of 300 μm thick was used as a base film and a biaxially-stretched polyethylene terephthalate film with an addition of 0.5 part by weight of erucic amide and having a surface roughness of 5 μm max. was employed as a separator. The results are shown in Table 1. The separator exhibited poor releasability.

Comparative Example 3

An experiment was conducted in a similar manner to Example I except that a commercial butadiene rubber sheet of 300 μm thick was used as a base film and an unstretched low-density polyethylene film with an addition of 1.0 part by weight of erucic amide and having a surface roughness of 3 μm max. was used as a separator. The results are shown in Table 1. The separator exhibited poor releasability and, when peeled off, the separator was elongated and had poor workability.

Comparative Example 4

An experiment was conducted in a similar manner to Example 1 except that a biaxially-stretched polypropylene film obtained by adding 0.5 part by weight of erucic amide and having a surface roughness of 3 μm max. was used as a separator. The results are shown in Table 1. No problems were encountered in workability when the separator was peeled off from the wafer machining film.

TABLE 1

| | Separator | | | Evaluation results | | |
|---|---|---|---|---|---|---|
| | Surface roughness (μm) | Lubricant content (wt. part) | Material*[1] | Degree of oxidation | Degree of contamination | Breakdown voltage (V) |
| Ex. 1 | 1 | 0.1 | Biaxial PP | 1.30 | 15 | 22 |
| Ex. 2 | 2 | 0.5 | Biaxial PP | 1.30 | 26 | 22 |
| Ex. 3 | 1 | 0.5 | Uniaxial PP | 1.31 | 44 | 22 |
| Ex. 4 | 2 | 1.0 | Biaxial PP | 1.31 | 78 | 22 |
| Ex. 5 | 1 | 0.1 | Biaxial PET | 1.32 | 116 | 22 |
| Ex. 6 | 0.5 | 0 | Biaxial PP | 1.30 | 9 | 22 |
| Comp. Ex. 1 | 3 | 2.0 | Biaxial PP | 1.58 | 875 | 16 |
| Comp. Ex. 2 | 5 | 0.5 | Biaxial PET | 1.62 | 890 | 15 |
| Comp. Ex. 3 | 3 | 1.0 | Unstretched PE | 1.51 | 743 | 16 |
| Comp. Ex. 4 | 3 | 0.5 | Biaxial PP | 1.61 | 525 | 16 |
| Standard value | — | — | — | 1.30 | — | 22 |

*[1]Biaxial: Biaxially-stretched, Uniaxial: Uniaxially-stretched.
PP: Polypropylene. PET: Polyethylene terephthalate. PE: Polyethylene.

We claim:

1. A wafer processing film comprising a base film, an adhesive layer provided on one surface of said base film and a polypropylene film arranged on said adhesive, layer,, the surface roughness of the surface of said polypropylene film in contact with said adhesive layer being not greater than 2 μm.

2. The wafer processing film according to claim 1, wherein the Shore "D" hardness of said polypropylene film is at least 30.

3. The wafer, processing film according to claim 1, wherein said polypropylene film is a biaxially stretched film.

4. The wafer processing film according to claim 1 or 3, wherein said polypropylene film contains a lubricant in a proportion not greater than 0.5 part by weight per 100 parts by weight of polypropylene.

5. The wafer processing film according to claim 1 or 2, wherein said polypropylene fiim contains a lubricant in a proportion not greater than 0.1 part by weight per 100 parts by weight of polypropylene.

* * * * *